(12) United States Patent
Menard et al.

(10) Patent No.: US 7,797,998 B2
(45) Date of Patent: *Sep. 21, 2010

(54) ACCELEROMETER WITH REDUCED EXTRANEOUS VIBRATIONS OWING TO IMPROVED ELECTRODE SHAPE

(75) Inventors: Jean-Paul Menard, Pornic (FR); Maurice Moreau, Landemont (FR)

(73) Assignee: Sercel, Carquefuo (FR)

( * ) Notice: Subject to any disclaimer, the term of this patent is extended or adjusted under 35 U.S.C. 154(b) by 466 days.

This patent is subject to a terminal disclaimer.

(21) Appl. No.: 11/630,703

(22) PCT Filed: Aug. 11, 2004

(86) PCT No.: PCT/FR2004/002123

§ 371 (c)(1),
(2), (4) Date: Dec. 20, 2006

(87) PCT Pub. No.: WO2005/017537

PCT Pub. Date: Feb. 24, 2005

(65) Prior Publication Data

US 2008/0196500 A1    Aug. 21, 2008

(30) Foreign Application Priority Data

Aug. 13, 2003  (FR) .................................. 03 09899

(51) Int. Cl.
  *G01P 15/13*    (2006.01)
  *G01P 15/125*    (2006.01)
(52) U.S. Cl. ................. 73/514.18; 73/514.32

(58) Field of Classification Search .............. 73/514.18, 73/514.32
See application file for complete search history.

(56) References Cited

U.S. PATENT DOCUMENTS

| 5,343,766 | A * | 9/1994 | Lee ......................... 73/514.18 |
| 6,508,126 | B2 * | 1/2003 | Sakai et al. .............. 73/514.32 |
| 7,552,638 | B2 * | 6/2009 | Menard et al. ........... 73/514.18 |

* cited by examiner

*Primary Examiner*—John E Chapman
(74) *Attorney, Agent, or Firm*—Blakely, Sokoloff, Taylor & Zafman LLP

(57) ABSTRACT

The invention relates to an accelerometer comprising a moving mass (5) and a fixed part (2), which uses variations in capacitance (3, 4) in order to detect the movement of the mass (5). The inventive accelerometer comprises a first series of electrodes (4) which are solidly connected to the mass (5) and which are interdigitated with a series of electrodes (3, 7) which are solidly connected to the fixed part (2). According to the invention, each moving electrode (4), together with an adjacent fixed electrode (3), forms a capacitance which varies according to the position of the moving mass (5). The accelerometer further comprises an electronic circuit which is used to detect the variation in at least one capacitance between the moving mass (5) and the fixed part (2), in the form of a moving mass displacement indicator. The invention is characterised in that one or more or the electrodes (3, 4) or the moving mass (5) and/or the fixed part (2) takes the form of a finger with a large base and a profile which narrows in the direction of the free end thereof. Moreover, the recurring return stress can be selected such that the mechanical power has an essentially zero power zone at the mechanical resonance frequency of the electrodes.

16 Claims, 2 Drawing Sheets

ACCELEROMETER WITH REDUCED EXTRANEOUS VIBRATIONS OWING TO IMPROVED ELECTRODE SHAPE

The invention relates to micromachined accelerometers which make it possible in particular to measure the movement of the ground for geophysical applications (mapping of the subsurface by seismic method).

The invention relates in particular to accelerometers which implement a mass/spring system, in particular when the mass forms a series of fingers which are interdigitated with corresponding fingers of a fixed part.

In this type of device, each pair of opposite fingers forms a measurement capacitor.

It will also be recalled here that the fingers constituting the capacitors may be used at one and the same time for measuring the displacement by measuring the variation in capacitance, and at one and the same time for restoring the mass to its original position, by applying an electrostatic force within each capacitance thus formed. The electrostatic restoring force may be slaved to the preceding capacitive displacement measurement.

All of these well-known considerations are described in the prior art, in particular in patent FR 2 769 369.

With this type of accelerometer, the person skilled in the art is typically confronted with the presence of noise superimposed on the measurement.

In the case of accelerometers incorporating a series of interdigitated electrodes, it turns out that part of the noise originates from a vibration appearing in an undesired manner at the level of each finger. This noise, which may have various origins, may in particular originate from an outside, loading whose frequency spectrum covers the frequency of vibration of the fingers.

In the particular case of accelerometers with restore of moveable part, and in particular accelerometers with slaved restore, this vibration may furthermore be fed mechanically through the restoring forces which are applied repeatedly to the mass. In this case, this vibration produces a modulation of amplitude of the restoring force. This results in undesirable noise in the band of interest.

The presence of noise having any one of these various origins forms a first problem.

A second problem resides in the fact that the fingers turn out to be fragile in bending. Whether they vibrate in resonance or whether they are simply subjected to strong accelerations, these fingers are prone to damage by bending.

To solve one of these two problems or both together, the invention consists of an accelerometer with moveable mass and fixed part using variations in capacitance to detect the movement of the mass, in which a first series of electrodes solidly connected to the mass is interdigitated with a series of electrodes solidly connected to the fixed part, each moveable electrode forming, together with an adjacent fixed electrode, a variable capacitance varying as a function of the position of the moveable mass, the accelerometer furthermore comprising an electronic circuit designed to detect the variation in at least one capacitance between moveable mass and fixed part in the guise of indicator of the displacement of the moveable mass, characterized in that one or more electrode(s) of the moveable mass and/or of the fixed part each exhibit a finger shape with a wide base and with a profile narrowing towards the free end.

Other characteristics, aims and advantages of the invention will become apparent on reading the detailed description which follows, given with reference to the appended drawings in which:

FIG. 1 diagrammatically represents a particular embodiment of an acceleration sensor according to the invention;

Figure 1:
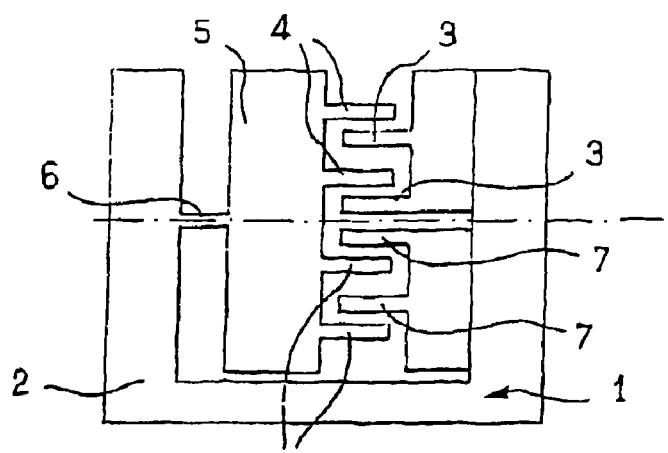

The acceleration sensor represented in FIG. 1 comprises the following elements, embodied in one and the same semiconductor substrate 1:
- a fixed armature 2;
- two series of fixed electrodes 3 and 7 connected rigidly to the armature 2;
- a series of electrodes 4 supported by a moveable plate 5;
- springs 6 linking the moveable plate 5 to the armature 2 (a single spring is represented here, for reason of clarity of the drawing);

The moveable electrodes 4 are electrically insulated from the fixed electrodes 3 and 7.

The electrodes 3 form together with the opposite electrodes 4 a capacitor C1. The electrodes 7 form together with the opposite electrodes 4 a capacitor C2.

When the moveable mass is displaced with respect to the fixed part, the values of C1 and C2 vary in opposite directions. This makes it possible to measure the relative position of the moveable mass. Furthermore, in the present embodiment, a voltage applied across the terminals of C1 produces an electrostatic force which tends to make the electrodes 3 and 4 approach one another, hence to displace the moveable mass in one direction, while a voltage applied to the terminals of C2 tends to displace the moveable mass in the other direction.

An electronic circuit, not represented here and known to the person skilled in the art, is connected to each series of fixed electrodes 3 and 7 and to the series of moveable electrodes 4.

Preferably of type with switched capacitances, this circuit is regulated in tempo with a clock, and applies cyclically, by successive phases, a measurement voltage across the terminals of each capacitor, making it possible to measure their capacitance (differential measurement of the two neighboring capacitances). The displacement measured is indicative of the displacement of the moveable plate 5 due to the pointwise acceleration present. The duration of the phase of application of a measurement voltage, denoted Tc and also called duration of loading, or else duration of the detector phase, is much less than the resonant period of the system (and hence than the period of vibration of the ground).

The slaving deployed here consists in canceling out the relative movement of the mass 5 by applying a force between the series of moveable electrodes and one or the other of the series of fixed electrodes (C1 or C2). This is an electrostatic force and it is the actuator phase when the latter is applied in a manner temporally distinct from the detector phase.

It is preferably the same electronic circuit which alternatively measures the position of the moveable mass and tends to bring it back to its initial position by applying the appropriate voltages across the terminals of the capacitors C1 and/or C2.

Thus the circuit defines a multiplexing between measurement and feedback, with preferably a discharging of the capacitors between these two steps.

The range of frequencies for the multiplexing is for example 100 to 500 times the resonant frequency of the system.

In another embodiment, the restoring of the moveable mass may be implemented simultaneously with the measurement of displacement.

The mechanical chip typically resonates at 500 Hz. The resonant; frequency, preferably chosen to be as close as possible to the frequency of vibration of the ground, is, in the present example, adjusted by tailoring an electrostatic stiffness $k_e$. This stiffness is superimposed on the mechanical stiffness and adjusted through the duration of the step of loading of measurement of the capacitances.

The electrostatic stiffness is chosen here so as to lower the resonant frequency of the system, the mechanical stiffness being chosen deliberately beyond the top frequency of the band of interest.

This optional arrangement, known from document FR 2 769 309, makes it possible to limit slumping, to reduce the inter-electrode distance, and hence to use is strong electric fields (hence a high electrostatic stiffness).

This arrangement furthermore makes it possible to optimize the performance in the useful passband and to compensate for the spread in mechanical stiffness of the springs for suspending moveable plates, which spread is observed typically with the customary manufacturing processes.

By virtue of the electrostatic stiffness, the apparent frequency is brought down to 140 Hz so as to best reduce the noise in the useful band (0-200 Hz).

The fixed and moveable electrodes have the shape of "fingers", customarily parallelepipedal silicon beams connected together by a base in the manner of a comb. Each of these fingers exhibits a resonant frequency corresponding to that of a beam built in at one end.

In the present case, the resonant frequency of the fingers was typically 90 kHz and went to 585 kHz after a first modification described in the text which follows.

The inventors have identified that these fingers have a tendency to resonate considerably, and to do so with all the greater amplitude when the ambient pressure is very low inside the chip.

The resulting movement is responsible for the baseband aliasing, by frequency transposition of the noise present in the slaving force, and hence the degradation of the overall noise of the geophone, in particular when increasing the maximum acceleration compensatable ($A_{max}$) with the actuator.

The spectral components of the respective restoring signal applied to the mass will be analyzed hereinbelow.

In order to set forth the means implemented for limiting the resonance of the fingers, we firstly deal here with the observation according to which the repeated slaving force, F, applied to the moveable plate 5, is expressed by $F=(\epsilon.S.V^2)/(2.d^2)$ with S: opposing surface area of the electrodes, V: voltage between the electrodes and d: distance between the electrodes. If V and d vary with time, we may write $F(t)=F1(t).F2(t)$ with $F1(t)=V(t)^2$ and $F2(t)=\epsilon.S/2.d(t)^2$.

A temporal multiplication giving rise to a frequency convolution, we have $F(f)=F1(f) \otimes F2(f)$.

Figure 2A:
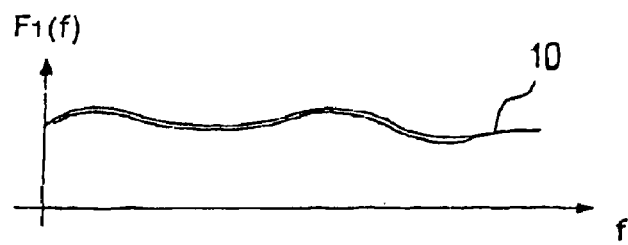
FIGS. 2a to 2c are plots representing the frequency spectra respectively of the noise related to the voltage for restoring the mass, of a function for transforming this voltage into force with and without resonance of the fingers, and of the resulting force, with and without resonance of the fingers here again.
Figure 2B:
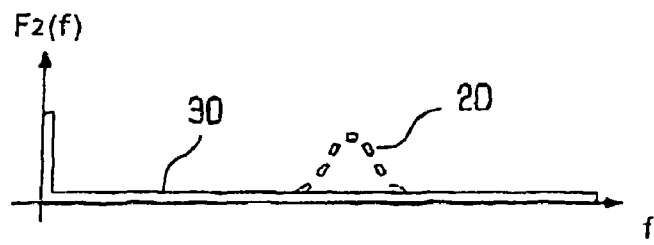
Figure 2C:
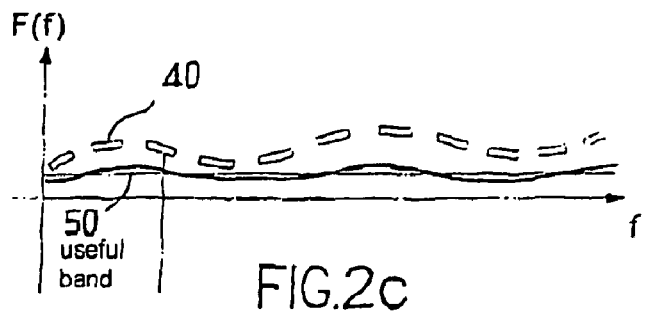

The form of F1(f) is represented in FIG. 2a, by the curve 10 (in the absence of any acceleration signal) and that of F2(f) in FIG. 2b (curve 20: fingers resonating, curve 30 fingers not resonating). The form of the force spectrum F(f) is also represented in FIG. 2c (curve 40: fingers resonating and 50: fingers not resonating).

The upturn in undesirable noise in baseband due to the resonance of the fingers is apparent.

Stated otherwise, the fingers begin resonating on account of the fact that their natural frequency is highly represented in the energy spectrum of the repetitive slaving force as adopted in this type of accelerometer.

Figure 3:
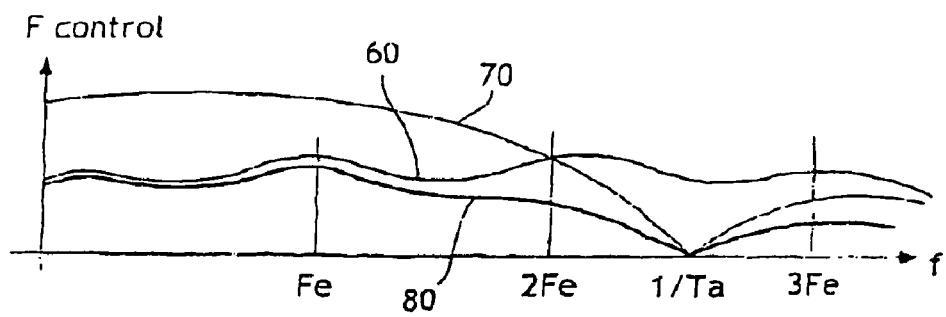
FIG. 3 represents the frequency spectra of a pulsed slaving voltage and of a slot-like signal windowing this voltage.

Note that, on account of the sampling, the spectrum is repeated to infinity with a recurrence Fe, sampling frequency, as represented under the reference 60 in FIG. 3.

It is interesting to note that, because the feedback force exhibits the form of repeated pulses of width Ta and not the form of Diracs (zero width), this signifies that this spectrum 60 is multiplied by a cardinal sine function with a first zero at the frequency 1/Ta.

In FIG. 3, the curve 60 represents the slaving spectrum frequency-wise with pulses of short duration (Dirac) and curve 80 with the actual pulses, of duration Ta hence with fairly wide zones with almost nonexistent power. Along the ordinate is plotted the value of the slaving force $F_{control}$ as a function of frequency f.

In FIG. 3, the curve 70, frequency transform of the signal with pulses of duration Ta, is a cardinal sine of formula Sin (Pi.T.Fa)/(Pi.FaTa) (with a first zero at the frequency 1/Ta).

Curve 80 is therefore/the result of multiplying curve 60 by curve 70.

We propose here to exploit these hitherto unexploited energy dips.

Accordingly, a match between one of these energy dips and the resonant frequency of the fingers is deployed.

A first preferential arrangement is to choose a positioning of the cardinal sine so as to place a return to zero of the energy on the resonant frequency of the fingers, the spectrum resulting from the product then also having a return to zero at the resonance.

This positioning is performed for example by choosing an appropriate value of Ta, in such a way that the value 1/Ta is placed on the resonant frequency of the fingers. It is possible, in the same manner, to use other returns to zero of the cardinal sine 70.

It will be noted that this presupposes that the frequency of the fingers is greater than Fe, Ta not being able to be >Te (Te designates the sampling period).

The choice of a spectrum thus placed allows a significant gain in the noise level of the accelerometer.

According to another arrangement, the fixed and/or moveable fingers 3 and 4 are configured so that their resonance is brought down into such a natural energy well, which well is due to the application of the forces for the actuator phase durations Ta flanked by returns to zero of the restoring force. The preferred frequency for the resonance of the fingers is that equal to 1/Ta, corresponding to the first return to zero of the cardinal sine, the transform of the slot-like signal.

Typically, Ta equals 14/32 Te, therefore 1/Ta=585 kHz for Fe=256 kHz.

In a parallelepipedal version, to increase the resonant frequency of the fingers in a ratio of 6.5 without reducing the length in the ratio of the square root of (6.5), fingers of a length 160 μm would be required, which is incompatible with the voltage capabilities of the electronics (to actuate the mass, high voltages would be required).

Figure 4:
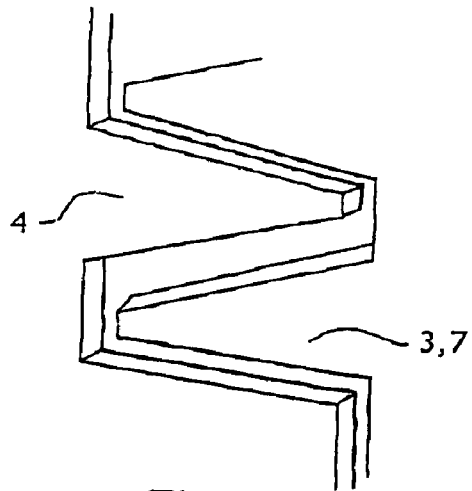
FIG. 4 represents interdigitated electrodes according to a variant of the invention.

To modify the resonant frequency of the fingers, a trapezoidal profile as illustrated in FIG. 4 is preferably adopted here.

With fingers having a length of 240 μm, a width L at the level of the anchoring having a value of 20 μm and a width I at the vertex of 4 μm, a resonant frequency of 585 kHz is typically achieved.

Figure 5:
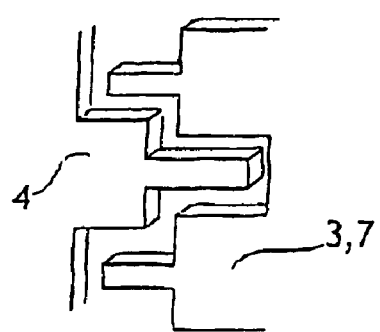
FIG. 5 represents interdigitated electrodes according to another variant of the invention.

Another embodiment, represented in FIG. 5, consists in adopting a shape with successive abrupt reductions in width, towards the free end.

Such an embodiment exhibits additional advantages in its ease of production with simple stamping machines. Specifically, fingers of such a shape require no oblique cut, thereby easing the stamping operation.

The adoption of a wide base for a tapered shape decreases the bending mass and raises the mechanical strength at the base. The resonant frequency in bending is very markedly increased. Moreover the amplitudes of oscillations are very markedly reduced. However, the opposing surface areas between adjacent fingers remain almost unchanged in extent, thus practically not affecting the electrical properties of the capacitors present.

The trapezoidal shape is preferred since the latter exhibits no sub-part that is rectilinear and hence particularly flexible locally.

Provision is also made for a variant finger with curved edges, for example with convex external curvature, but which may also be concave, forming a general rounded shape of trapezium. Such a shape turns out to be more compact and exhibits an even higher resonant frequency.

Although a shape of finger with width decreasing on approaching the free end is beneficial to the bending strength, it may be advantageous to adopt a different shape, in particular to shift the resonant frequency towards a higher frequency.

It should be noted that this geometrical modification of the resonant frequency of the fingers, set forth here with reference to an internal vibration source, also makes it possible to evade sources of vibration of other kinds.

Thus, in the case of nonslaved accelerometers, and also of nonmultiplexed accelerometers (that is to say in particular ones in which restore is done simultaneously with measurement), the modification of the resonant frequency of the fingers makes it possible to evade frequencies of loadings of external origin.

Thus, the resonant frequencies of the fingers are placed outside of the frequency spans of the vibrations of external origin, which, otherwise, would give rise to loadings.

It will be noted that the higher the resonant frequency, the smaller the amplitude of the movement.

The invention claimed is:

1. An accelerometer with moveable mass (5) and fixed part (2) using variations in capacitance (3, 4) to detect the movement of the mass (5), in which a first series of electrodes (4) solidly connected to the mass (5) is interdigitated with a series of electrodes (3, 7) solidly connected to the fixed part (2), each moveable electrode (4) forming, together with an adjacent fixed electrode (3), a variable capacitance varying as a function of the position of the moveable mass (5), the accelerometer furthermore comprising an electronic circuit that detects the variation in at least one capacitance between moveable mass (5) and fixed part (2), said electronic circuit acting as an indicator of the displacement of the moveable mass characterized in that at least one electrode (3, 4) of the moveable mass (5) and/or of the fixed part (2) each exhibit a finger shape with a wide base and with a profile narrowing in the direction of their free end, and the electronic circuit generates a repetitive electrostatic restoring force and in that the repetitive electrostatic force is specifically chosen so that a mechanical power frequency spectrum (10, 201) of said repetitive electrostatic force exhibits a zone with substantially zero power at a mechanical resonant frequency of the electrodes (4) of the moveable mass (5) and/or of the fixed part (2).

2. The accelerometer as claimed in claim 1, wherein the electronic circuit generates an electrostatic force for restoring the moveable mass (5) to a original position of the moveable mass (5).

3. The accelerometer as claimed in claim 2, wherein the electronic circuit generates the electrostatic restoring force in a manner slaved to a measurement of displacement of the moveable mass (5).

4. The accelerometer as claimed in any one of the preceding claims, characterized in that the electrodes (3, 4) of the moveable mass (5) and/or of the fixed part (2) exhibit at least one portion with continuous alteration of the width of their cross section.

5. The accelerometer of claim 1, wherein the electrodes (3, 4) of the moveable mass (5) and/or of the fixed part (2) exhibit at least one portion the width of whose cross section exhibits abrupt alterations.

6. The accelerometer of claim 1, wherein the electrodes (3, 4) of the moveable mass (5) and/or of the fixed part (2) exhibit at least one portion wherein the profile of said at least one portion which narrows towards the free end of the electrode is the width.

7. The accelerometer of claim 1, wherein the electrodes (3, 4) of the moveable mass (5) and/or of the fixed part (2) include a trapezoidal shape of width (L, l) decreasing towards their free end.

8. The accelerometer of claim 1, wherein the electrodes (3, 4) of the moveable mass (5) and/or of the fixed part (2) include a portion the width of whose cross section (L, l) varies in tiers of constant width, the width (L, l) changing in an abrupt manner between each tier.

9. The accelerometer of claim 1, wherein the electrodes (3, 4) of the moveable mass (5) and/or of the fixed part (2) include a portion whose width decreases progressively towards the free end of the electrode, forming at least one rounded lateral edge.

10. The accelerometer of claim 1, wherein the electrodes (3) of the fixed part (2) exhibit a shape complementary to the interstice between two adjacent electrodes (4) of the moveable mass (5).

11. The accelerometer as claimed in claim 1, wherein the means of slaving implement a repeated restoring of the moveable mass in time slots (Ta), and in that the frequency transform (20) of the corresponding slot-like signal exhibits a return substantially to zero at the level of the resonant frequency of the electrodes (3, 4) of the moveable part (5) and/or of the fixed part (2).

12. The accelerometer as claimed in claim 11, characterized in that the mean duration of the slots is predetermined so that the frequency transform (20) of the slot-like signal exhibits the return substantially to zero at the level of the resonant frequency of the electrodes (3, 4) of the moveable part (5) and/or of the fixed part (2).

13. The accelerometer as claimed in claim 12, wherein the mean duration of the slots (Ta) is chosen so that a frequency transform (20) of the slots exhibits a first return to zero (1/Ta) at the level of the resonant frequency of the electrodes (4) of the moveable part (5) and/or of the fixed part (2).

14. The accelerometer of claim 1, wherein the electrostatic restoring force is implemented through time slots of mean width Ta, and in that Ta is chosen according to the relation $1/Ta=F$ where F is the resonant frequency of the electrodes (4) of the moveable part (5) and/or of the fixed part (2).

15. The accelerometer as claimed in claim 14, characterized in that the frequency transform of the slot-like signal exhibits the shape of a cardinal sine.

16. The accelerometer of claim 1, wherein the edges of the fingers of electrodes have a curvature which is one of zero or convex.

* * * * *